United States Patent
Astle et al.

(10) Patent No.: US 10,449,568 B2
(45) Date of Patent: Oct. 22, 2019

(54) MASKING SUBSTRATES FOR APPLICATION OF PROTECTIVE COATINGS

(71) Applicant: HzO, Inc., Draper, UT (US)

(72) Inventors: David James Astle, Park City, UT (US); Tyler Christensen Child, South Jordan, UT (US); Vimal Kumar Kasagani, Taylorsville, UT (US); Cameron LaMar Loose, Roy, UT (US); Blake LeRoy Stevens, Morristown, NJ (US); Max Ernest Sorenson, Cottonwood Heights, UT (US)

(73) Assignee: HZO, INC., Draper, UT (US)

( * ) Notice: Subject to any disclaimer, the term of this patent is extended or adjusted under 35 U.S.C. 154(b) by 0 days.

(21) Appl. No.: 14/157,684

(22) Filed: Jan. 17, 2014

(65) Prior Publication Data

US 2014/0192464 A1    Jul. 10, 2014

Related U.S. Application Data

(63) Continuation of application No. PCT/US2014/010526, filed on Jan. 7, 2014.
(Continued)

(51) Int. Cl.
*H01L 21/00* (2006.01)
*B05D 1/32* (2006.01)
(Continued)

(52) U.S. Cl.
CPC .............. *B05D 1/322* (2013.01); *C09J 9/00* (2013.01); *H01L 21/56* (2013.01); *H01L 21/561* (2013.01);
(Continued)

(58) Field of Classification Search
CPC . C23C 14/042; B05B 15/045; B05B 15/0475; B05D 5/00; B05D 1/325;
(Continued)

(56) References Cited

U.S. PATENT DOCUMENTS

| 3,661,641 A | 5/1972 | Vigh et al. |
| 3,670,091 A | 6/1972 | Frantz et al. |

(Continued)

FOREIGN PATENT DOCUMENTS

| CN | 1826710 A | 8/2006 |
| CN | 101442896 A | 5/2009 |

(Continued)

OTHER PUBLICATIONS

United States Patent and Trademark Office, As the International Searching Authority, "International Search Report and Written Opinion," dated Mar. 13, 2013, in PCT application No. PCT/US2013/020850.
(Continued)

*Primary Examiner* — David P Turocy
*Assistant Examiner* — Mohammad Mayy
(74) *Attorney, Agent, or Firm* — Intellectual Strategies

(57) ABSTRACT

A method for applying a protective coating to selected portions of a substrate is disclosed. The method includes applying a mask to or forming a mask on at least one portion of the substrate that is not to be covered with the protective coating. The mask may be selectively formed by applying a flowable material to the substrate. Alternatively, the mask may be formed from a preformed film. With the mask in place, the protective coating may be applied to the substrate and the mask. A portion of the protective coating that overlies the mask may be delineated from other portions of the protective coating; for example, by cutting, weakening or removing material from the protective coating at locations
(Continued)

at or adjacent to the perimeter of the mask. The portion of the protective coating that overlies the mask, and the mask, may then be removed from the substrate.

11 Claims, 7 Drawing Sheets

Related U.S. Application Data

(60) Provisional application No. 61/750,254, filed on Jan. 8, 2013, provisional application No. 61/750,257, filed on Jan. 8, 2013.

(51) Int. Cl.

| | | |
|---|---|---|
| *H01L 21/67* | (2006.01) | |
| *H01L 21/56* | (2006.01) | |
| *H05K 3/00* | (2006.01) | |
| *H05K 3/28* | (2006.01) | |
| *H05K 1/18* | (2006.01) | |
| *C09J 9/00* | (2006.01) | |
| *H01L 23/31* | (2006.01) | |

(52) U.S. Cl.
CPC .... *H01L 21/67011* (2013.01); *H01L 21/6715* (2013.01); *H05K 1/181* (2013.01); *H05K 3/0079* (2013.01); *H05K 3/284* (2013.01); *C09J 2201/61* (2013.01); *H01L 23/3121* (2013.01); *H01L 2924/0002* (2013.01); *H05K 3/0073* (2013.01); *H05K 2201/0145* (2013.01); *H05K 2201/09872* (2013.01)

(58) Field of Classification Search
CPC ......... C09D 5/008; C09J 9/00; C09J 2201/00; H05K 1/00; H05K 3/00; H05K 2201/00; H01L 21/00; H01L 2924/00; H01L 23/00
See application file for complete search history.

(56) References Cited

U.S. PATENT DOCUMENTS

| | | | | |
|---|---|---|---|---|
| 3,892,892 | A * | 7/1975 | Hofer | B05D 1/60 427/272 |
| 4,059,708 | A | 11/1977 | Heiss, Jr. et al. | |
| 4,234,357 | A | 11/1980 | Scheppele | |
| 4,254,174 | A * | 3/1981 | Flanders et al. | 428/209 |
| 4,255,469 | A | 3/1981 | McGinness | |
| 4,300,184 | A * | 11/1981 | Colla | 361/748 |
| 4,495,254 | A * | 1/1985 | Hoffman | A44C 27/005 368/280 |
| 4,528,261 | A * | 7/1985 | Hauser | G03F 7/161 430/311 |
| 4,631,250 | A | 12/1986 | Hayashi | |
| 4,784,310 | A | 11/1988 | Metzger et al. | |
| 4,814,943 | A | 3/1989 | Okuaki | |
| 4,885,187 | A * | 12/1989 | Koenig | B05D 1/24 427/185 |
| 5,009,311 | A | 4/1991 | Schenk | |
| 5,024,879 | A | 6/1991 | Massa et al. | |
| 5,102,712 | A | 4/1992 | Peirce et al. | |
| 5,176,312 | A | 1/1993 | Lowenthal | |
| 5,184,427 | A | 2/1993 | Armstrong | |
| 5,188,669 | A * | 2/1993 | Donges et al. | 118/503 |
| 5,246,730 | A * | 9/1993 | Peirce | H05K 3/284 118/505 |
| 5,271,953 | A | 12/1993 | Litteral | |
| 5,456,955 | A | 10/1995 | Muggli | |
| 5,460,767 | A * | 10/1995 | Sanftleben | B29C 39/021 156/155 |
| 5,536,282 | A | 7/1996 | Yoon et al. | |
| 5,543,008 | A | 8/1996 | Hidber et al. | |
| 5,587,207 | A | 12/1996 | Gorokhovsky | |
| 5,708,056 | A | 1/1998 | Lindley et al. | |
| 5,885,854 | A | 3/1999 | Wensel | |
| 5,888,308 | A * | 3/1999 | Sachdev et al. | 134/1 |
| 5,925,069 | A | 7/1999 | Graves et al. | |
| 5,989,622 | A | 11/1999 | Iwashita et al. | |
| 6,043,437 | A | 3/2000 | Schulman et al. | |
| 6,060,683 | A | 5/2000 | Estrada | |
| 6,138,349 | A * | 10/2000 | Vinciarelli | H01L 21/4846 216/43 |
| 6,280,821 | B1 | 8/2001 | Kadunce et al. | |
| 6,306,688 | B1 | 10/2001 | Lunceford | |
| 6,316,169 | B1 * | 11/2001 | Vahedi | H01L 21/0274 216/37 |
| 6,447,847 | B1 | 9/2002 | Hynes et al. | |
| 6,592,018 | B2 | 7/2003 | Taylor et al. | |
| 6,635,510 | B1 | 10/2003 | Kraft et al. | |
| 6,635,553 | B1 | 10/2003 | DiStefano et al. | |
| 6,697,217 | B1 | 2/2004 | Codilian | |
| 6,793,544 | B2 | 9/2004 | Brady et al. | |
| 6,940,022 | B1 | 9/2005 | Vinciarelli et al. | |
| 6,956,963 | B2 | 10/2005 | Ulrich et al. | |
| 6,980,647 | B1 | 12/2005 | Daugherty et al. | |
| 7,109,055 | B2 | 9/2006 | McDonald et al. | |
| 7,273,767 | B2 | 9/2007 | Ong et al. | |
| 7,531,100 | B2 * | 5/2009 | Peters | C23C 14/042 216/17 |
| 7,632,698 | B2 | 12/2009 | Hooper et al. | |
| 7,681,778 | B2 | 3/2010 | Gottshall et al. | |
| 7,897,881 | B2 | 3/2011 | Kaspar et al. | |
| 8,002,948 | B2 * | 8/2011 | Haubrich et al. | 156/703 |
| 8,408,379 | B2 | 4/2013 | Malek et al. | |
| 8,544,781 | B2 | 10/2013 | Pan et al. | |
| 2002/0088636 | A1 | 7/2002 | Noguchi et al. | |
| 2002/0170897 | A1 | 11/2002 | Hall | |
| 2002/0187260 | A1 | 12/2002 | Sheppard, Jr. et al. | |
| 2003/0143845 | A1 | 7/2003 | Mori et al. | |
| 2004/0056039 | A1 | 3/2004 | Sarajian | |
| 2004/0058070 | A1 * | 3/2004 | Takeuchi et al. | 427/282 |
| 2004/0065554 | A1 | 4/2004 | Cohen | |
| 2004/0100164 | A1 | 5/2004 | Murata et al. | |
| 2005/0008848 | A1 | 1/2005 | Saccomanno et al. | |
| 2005/0081354 | A1 | 4/2005 | Motzno et al. | |
| 2005/0179140 | A1 | 8/2005 | Goodner et al. | |
| 2006/0013961 | A1 | 1/2006 | Fournier et al. | |
| 2006/0042659 | A1 | 3/2006 | Fernandez et al. | |
| 2006/0199408 | A1 * | 9/2006 | Hoisington et al. | 439/108 |
| 2006/0264153 | A1 | 11/2006 | Jaubertie | |
| 2006/0278971 | A1 * | 12/2006 | Barnes | H01L 21/4853 257/701 |
| 2007/0087131 | A1 | 4/2007 | Hutchinson et al. | |
| 2007/0095368 | A1 | 5/2007 | Girard et al. | |
| 2007/0157457 | A1 | 7/2007 | Fried | |
| 2007/0206365 | A1 * | 9/2007 | Shiu | H05K 3/284 361/752 |
| 2007/0246820 | A1 | 10/2007 | Zohni et al. | |
| 2008/0147158 | A1 | 6/2008 | Zweber et al. | |
| 2008/0283180 | A1 | 11/2008 | Bachman et al. | |
| 2009/0044900 | A1 | 2/2009 | Suehara et al. | |
| 2009/0263581 | A1 | 10/2009 | Martin, III et al. | |
| 2009/0263641 | A1 | 10/2009 | Martin, III et al. | |
| 2009/0283574 | A1 | 11/2009 | Okazaki et al. | |
| 2009/0301770 | A1 | 12/2009 | Cho et al. | |
| 2009/0304549 | A1 | 12/2009 | Coulson | |
| 2010/0124010 | A1 | 5/2010 | Shiu et al. | |
| 2010/0159699 | A1 | 6/2010 | Takahashi | |
| 2010/0173474 | A1 | 7/2010 | Arita et al. | |
| 2010/0203347 | A1 | 8/2010 | Coulson | |
| 2010/0277921 | A1 | 11/2010 | Sekowski et al. | |
| 2010/0293812 | A1 | 11/2010 | Coulson | |
| 2011/0090658 | A1 | 4/2011 | Adams et al. | |
| 2011/0094514 | A1 * | 4/2011 | Rakow et al. | 128/206.12 |
| 2011/0141205 | A1 | 6/2011 | Gerner et al. | |
| 2011/0231002 | A1 | 9/2011 | Vienot et al. | |
| 2011/0253429 | A1 | 10/2011 | Humphries et al. | |
| 2011/0262740 | A1 | 10/2011 | Martin, III et al. | |
| 2011/0316166 | A1 | 12/2011 | Yu et al. | |
| 2012/0070145 | A1 * | 3/2012 | Wong et al. | 396/439 |
| 2012/0146212 | A1 * | 6/2012 | Daubenspeck et al. | 257/737 |
| 2012/0193648 | A1 | 8/2012 | Donofrio et al. | |

(56) References Cited

U.S. PATENT DOCUMENTS

| | | |
|---|---|---|
| 2012/0296032 A1 | 11/2012 | Legein et al. |
| 2013/0174410 A1 | 7/2013 | Stevens et al. |
| 2013/0176691 A1 | 7/2013 | Stevens et al. |
| 2013/0176700 A1 | 7/2013 | Stevens et al. |
| 2013/0251889 A1 | 9/2013 | Cox et al. |
| 2013/0286567 A1 | 10/2013 | Sorenson et al. |
| 2013/0335898 A1 | 12/2013 | Stevens et al. |

FOREIGN PATENT DOCUMENTS

| | | | |
|---|---|---|---|
| CN | 102150480 A | 8/2011 | |
| CN | 102171852 A | 8/2011 | |
| CN | 102655949 A | 9/2012 | |
| EP | 350031 A2 * | 1/1990 | ............ B05C 21/00 |
| EP | 474194 A2 * | 3/1992 | ............ G03F 7/027 |
| EP | 0 350 031 B1 | 9/1993 | |
| EP | 0 474 194 B1 | 1/1997 | |
| GB | 697492 | 9/1953 | |
| JP | 62-248228 | 10/1987 | |
| JP | 07-302808 A | 11/1995 | |
| JP | 2000-299066 A | 10/2000 | |
| JP | 2002-043702 A | 2/2002 | |
| JP | 2005-079225 A | 3/2005 | |
| JP | 2005-172083 A | 6/2005 | |
| JP | 2005-260106 A | 9/2005 | |
| JP | 2007-279616 A | 10/2007 | |
| JP | 2008-018476 A | 1/2008 | |
| JP | 2009-505386 A | 2/2009 | |
| JP | 2009-178805 A | 8/2009 | |
| JP | 2009-292135 A | 12/2009 | |
| JP | 2010-225715 A | 10/2010 | |
| JP | 2012-500487 A | 1/2012 | |
| WO | 2007/138302 A1 | 12/2007 | |
| WO | 2010/020753 A2 | 2/2010 | |
| WO | 2011/037921 A1 | 3/2011 | |
| WO | 2011/089009 A1 | 7/2011 | |
| WO | 2012/106109 A1 | 8/2012 | |
| WO | 2013/106442 A1 | 7/2013 | |
| WO | 2014/110039 A2 | 7/2014 | |
| WO | 2014/110106 A1 | 7/2014 | |

OTHER PUBLICATIONS

United States Patent and Trademark Office Acting as the International Searching Authority, "International Search Report and Written Opinion" dated Nov. 29, 2013 in corresponding international application No. PCT/US2013/046392.

Christina Schmiedel et al., "Combined Plasma Laser Removal of Parylene Coatings," ISPC Conference, 2009, Bochum, Germany, accessible online www.ispc-conference.org/ispcproc/papers/239.pdf.

Chinese State Intellectual Property Office, "Notification of the First Office Action and Search Report," dated Jun. 2, 2015 in Chinese application No. 201480000038.7.

Office Action for Japanese Patent Application No. 2014-556841, dated Oct. 23, 2015.

United States Patent and Trademark Office Acting as the International Searching Authority, "International Search Report and Written Opinion," dated Aug. 21, 2014 in related international application No. PCT/US2014/010510.

United States Patent and Trademark Office acting as the International Searching Authority, "International Search Report and Written Opinion," dated Apr. 30, 2014, in related PCT application No. PCT/US2014/010526.

United States Patent and Trademark Office acting as the International Searching Authority, "International Search Report and Written Opinion," dated Mar. 13, 2013, in PCT application No. PCT/US2013/020850.

United States Patent and Trademark Office acting as the International Searching Authority, "International Search Report and Written Opinion," dated Nov. 29, 2013 in corresponding application No. PCT/US2013/046392.

European Search Report for EP14700800.7, dated Oct. 14, 2015.

Chinese State Intellectual Property Office, "Notification of the Second Office Action and Search Report," dated Apr. 4, 2016 in Chinese application No. 201480000038.7.

PCT patent application PCT/US14/10638 filed on an IDS as a foreign reference on Jan. 17, 2014, but considered a NPL by the USPTO.

Chinese State Intellectual Property Office, "Notification of the First Office Action and Search Report," dated Mar. 25, 2015 in Chinese application No. 201480000037.2.

United States Patent and Trademark Office acting as the International Searching Authority, "International Search Report and Written Opinion," dated Apr. 24, 2014 in related international application No. PCT/US2014/010638.

United States Patent and Trademark Office acting as the International Searching Authority, "International Search Report and Written Opinion," dated Dec. 2, 2013 in related international application No. PCT/US2013/046371.

* cited by examiner

MASKING SUBSTRATES FOR APPLICATION OF PROTECTIVE COATINGS

CROSS-REFERENCE TO RELATED APPLICATIONS

This application is a continuation of International Patent Application No. PCT/US2014/010526, which was filed pursuant to the Patent Cooperation Treaty on Jan. 7, 2014, titled MASKING SUBSTRATES FOR APPLICATION OF PROTECTIVE COATINGS. The '526 PCT Application claims the benefit of the Jan. 8, 2013, filing dates of U.S. Provisional Patent Application No. 61/750,257, titled METHODS FOR REMOVING PROTECTIVE COATING FROM AREAS OF AN ELECTRONIC DEVICE ("the '257 Provisional Application"), and U.S. Provisional Patent Application No. 61/750,254, titled METHODS FOR MASKING ELECTRONIC DEVICES FOR APPLICATION OF PROTECTIVE COATINGS AND MASKED ELECTRONIC DEVICES ("the '254 Provisional Application"). The entire disclosure each of the foregoing patent applications is hereby incorporated herein.

TECHNICAL FIELD

This disclosure relates generally to methods and systems for applying protective coatings, such as moisture-resistant coatings, to selected areas of substrates, such as electronic devices and subassemblies. More particularly, this disclosure relates to methods for masking components or features of a substrate prior to applying a protective coating to the substrate, and then selectively removing each mask and a portion of the protective coating that has been applied to the mask.

RELATED ART

The durability of electronic devices is often a concern to consumers, particularly with state-of-the-art portable electronic devices due to their cost and the extent to which consumers typically rely on the electronic devices. Accordingly, protective covers and protective cases for portable electronic devices, such as cellular telephones, tablet computers, laptop computers, and other electronic devices are in high demand. Many protective covers and cases prevent scratches and other physical damage to electronic devices, but protective covers typically provide little, if any, protection from water and other types of moisture, and few protective cases protect portable electronic devices from damage that may be caused by water and other types of moisture. Protective cases that provide protection against water damage generally do so by ensuring that the electronic device is not exposed to water; a typical waterproof protective case envelops the entire electronic device. As a result, waterproof cases are often somewhat bulky, or large, and may limit access to certain features of the electronic device and, thus, hinder an individual's ability to use the electronic device in the manner desired by the individual.

Some companies, such as HzO, Inc., take a different approach to protecting electronic devices from water, other types of moisture and contamination. HzO's approach employs the application of a thin film, or protective coating, to various components inside the electronic device. This protective coating limits exposure of coating components of the electronic device to water, other types of moisture and contamination without the need for a bulky protective case on the outside of the electronic device. Such a protective coating may protect the electronic device even if it is dropped in water, rained on, or otherwise exposed to damaging levels of moisture.

While protective coatings may limit exposure of coated features to water, other types of moisture or contaminants, protective coatings may also adversely affect the performance of some features of an electronic device. For example, a protective coating may reduce the resolution and clarity of the display and any camera lenses of the electronic device. A protective coating could also interfere with electrical contacts, such as battery terminals, connector pins, etc. The protective coating may also negatively impact the performance of certain parts, such as moving parts (e.g., vibration elements, etc.), microphones, speakers, lenses and the like. In addition, a protective coating could undesirably trap heat within electronic components (e.g., semiconductor device, etc.), decreasing their reliability and the speed with which they operate.

SUMMARY

This disclosure relates to approaches for masking components of a substrate, such as an electronic device or a subassembly of an electronic device, with a three-dimensional topography defined by a plurality of assembled components or features to which a protective coating is to be applied. A mask for such a substrate may cover a plurality of assembled components or features, and may be formed from a masking material that is suitable for application to a three-dimensional topography, such as that defined by the plurality of assembled components or features. Examples of suitable masking materials include, without limitation, preformed films and hot melt adhesives, as well as a variety of other materials.

A method for masking a substrate may include preparing a substrate to receive a mask. Preparation of the substrate may include cleaning (e.g., mechanically, chemically, by washing or rinsing, with a plasma, with radiation, etc.). In some embodiments, including those where a preformed film will define a mask on the substrate, the substrate may also be prepared by applying a sealant (e.g., a hot melt adhesive, a silicone, etc.) around each selected area of the substrate that is to be masked.

A masking method may also include preparing a mask material for application to one or more selected areas of the substrate that are to be masked. When a preformed film (e.g., a polyethylene film, a polyvinylchloride film, etc.) is used as the mask material, the mask material may be prepared by stretching and/or heating the preformed film. Such preparation may occur before or while the film is applied to the substrate. Masking may also include applying the mask material to the selected areas of the substrate. Application may be enhanced by forcing the film against a surface of the substrate in a manner that causes the film to substantially form to the shape of the selected area of the substrate (e.g., with a vacuum, under positive pressure, etc.). In embodiments where the substrate was prepared by applying a sealant, the sealant may secure a periphery of the film to the substrate. A mask that has been formed from a preformed film may be removed from a substrate by any of a variety of suitable techniques, including, but not limited to, peeling the mask away from the substrate.

In other embodiments, the mask may be defined from a material that may be selectively applied to the substrate (e.g., dispensed, sprayed, etc.). A specific embodiment of such a mask material is a so-called "hot glue" or hot melt adhesive, such as a low temperature hot glue. The glue may be heated and then applied to the selected area of the substrate in such a way that the glue defines a mask over the selected area of the substrate. As the glue cools to ambient temperature, it hardens, and may be subsequently removed (e.g., by peeling, etc.) from the substrate. Glue may be useful in masking smaller components or features, such as electrical contacts of a subassembly of an electronic device.

As other options, the mask material may be a grease (e.g., a synthetic grease, etc.), a gel (e.g., an anti-corrosive gel, etc.), a liquid masking agent (e.g., WONDERMASK™, available from Techspray of Amarillo, Tex.; CHEMASK®, available from ITW Chemtronics of Kennesaw, Ga.; etc.) or any other suitable material that may be selectively applied to the selected areas of the substrate to define a mask.

The mask material may be used to define masks within ports (e.g., universal serial bus (USB) ports, proprietary ports, headphone jack receptacles, and others) or other receptacles, openings or recesses. In some embodiments, the mask material may be used in conjunction with preformed masks that are configured complementarily to, and to engage, ports or other receptacles, openings or recesses. Combinations of the above masking techniques may be beneficially combined to mask various components of the electronic device.

When the mask is in place, a protective coating may be applied to the substrate, including each area of the substrate that is protected by a mask. After the protective coating is applied, the protective coating may be cut at a location at or adjacent to the periphery of each mask, and then the protective coating and the underlying mask may be removed from the substrate. If the protective coating is removed at a location just outside of the periphery of the mask, the mask may be removed from the substrate without tearing portions of the protective coating that are to remain in place on the substrate, which may provide the protective coating and, thus, the substrate with a more aesthetically pleasing finish.

Other aspects, as well as the features and advantages of various aspects, of the disclosed subject matter will become apparent to those of ordinary skill in the art from the ensuing description, the accompanying drawings, and the appended claims.

DETAILED DESCRIPTION

Figure 1A:
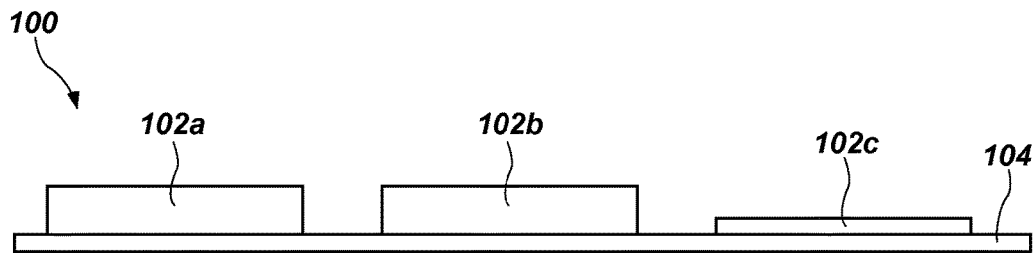
FIGS. 1A to 1C schematically represent an embodiment of a method of applying a mask to a substrate, such as a subassembly of an electronic device.
Figure 1B:
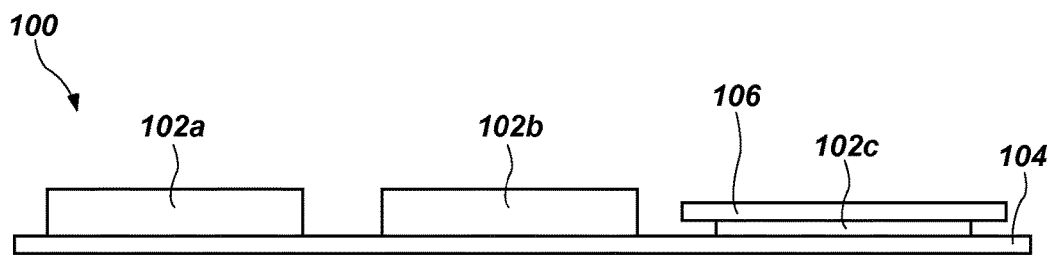
Figure 1C:
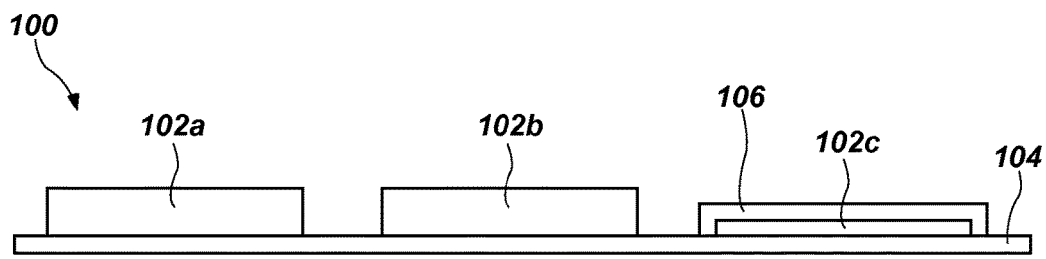

FIGS. 1A through 1C illustrate an embodiment of a substrate 100. In the depicted embodiment, the substrate 100 comprises a subassembly or an assembly of an electronic device. The substrate 100 may comprise all or part of a portable electronic device, such as a cellular telephone, a tablet computer, a camera, a global positioning system (GPS) receiver, a laptop computer, or any other electronic device. In an embodiment where the substrate 100 comprises a subassembly of an electronic device, it may include a printed circuit board (PCB) or other carrier 104 and one or more components or features 102a-c (e.g., semiconductor devices (e.g., processors, microcontrollers, memory devices, etc.), resistors, capacitors, ports, connectors, electrical contacts, buttons, switches, other components or features, etc.) on the carrier 104. In embodiments where the substrate 100 comprises a subassembly of an electronic device, it may also include other components, such as a display, all or part of a housing, or input/output elements. In another embodiment, the substrate 100 may comprise an entire electronic device.

As used herein, the terms "component" and "feature" are used broadly to encompass a variety of elements of a substrate 100, such as an electronic device. Certain components or features 102a-c may benefit from being covered or shielded by a protective coating (e.g., to prevent their exposure to moisture, contamination, etc.). However, a protective coating may adversely affect the operation or performance of other components or features 102a-c. Accordingly, it may be desirable to ultimately leave some components or features 102a-c uncoated.

FIG. 1B illustrates a mask material 106 being placed on a component or feature 102c of a substrate 100. The mask material 106 may be selected from a variety of materials that will prevent a protective coating from adhering to a location of the substrate (e.g., over a component or feature 102c, etc.) that is to be exposed through the protective coating. Use of a mask material 106 may be particularly useful where the protective coating is applied using non-selective techniques, such as chemical vapor deposition (CVD), molecular diffusion, physical vapor deposition (PVD) (e.g., evaporation deposition (including, but not limited to e-beam evaporation, sputtering, laser ablation, pulsed laser deposition, etc.), atomic layer deposition (ALD), or physical application processes (e.g., printing, spray-on techniques, rolling, brushing, etc.), which coat exposed components or features 102a-c regardless of whether or not coating of all components or features 102a-c is desired. The mask material 106 may be selected to withstand the conditions (e.g., temperatures, pressures, chemicals, etc.) associated with application of the protective coating.

A component or feature 102c of the substrate 100, or any other area of the substrate 100 (which area may include at least part of one or more components), that is to be covered by the mask material 106 may be referred to herein as a "selected area" or as a "masked component."

In one embodiment, a mask may be formed as a mask material 106 is selectively applied to the substrate 100. Various embodiments of mask materials 106 that may be dispensed or sprayed onto a substrate 100 include adhesive materials (e.g., cements, epoxies, hot-melt adhesives, etc.), greases, gels, liquid masking materials and the like. Such a mask material 106 may solidify once it has been applied to the substrate, and bond to the substrate 100 in such a way that the resulting mask may be subsequently peeled away or otherwise removed from the substrate 100. The mask material 106 may leave little to no residue (e.g., fugitive adhesive, etc.) on the substrate 100 when it is removed from the substrate 100.

In a specific embodiment, the mask material 106 may comprise a low temperature hot glue. In embodiments where the substrate 100 or its components or features 102c that are to be masked are delicate or sensitive to heat (e.g., when the substrate 100 is an electronic device, a subassembly of an electronic device, or the like), the use of a low temperature hot glue may prevent damage to the component or feature 102c when the mask material 106 is applied. Without limitation, a low temperature hot glue that has a softening point of about 97° C. to about 197° C. may be used as a mask material 106 for an electronic device. The mask material 106 may also be selected to be removable with relatively little force such that the mask formed from the adhesive can be removed from the substrate 100 or a component or feature 102c thereof without damaging the substrate 100, its component or feature 102c or the carrier 104. It may also be desirable to select a mask material 106 that does not react chemically with the portion(s) of the substrate that are being masked. A specific embodiment of such a mask material 106 is the hot melt adhesive available as TECHNOMELT TACK™ 003A from Henkel AG & Company, KGaA of Dusseldorf, Germany, or the hot melt adhesive sold as GIA 1057 Permanent EVA by Glue Machinery Corporation of Baltimore, Md. The mask material 106 may be applied to small components or features 102c on the substrate 100.

In another embodiment, the mask material 106 may comprise a film, which is also referred to herein as a "wrapper." As used herein, the term "wrapper" refers to a thin layer of material. The wrapper may be a thin, continuous sheet of material that is applied to components or features 102c of the substrate 100; in other embodiments, the wrapper may comprise a film that is formed on substrate 100 as a mask material 106 is applied to the substrate 100.

In embodiments where the mask material 106 is a wrapper, the wrapper may have a thickness of about 2 mils (i.e., 0.002 inch or about 0.05 mm) to about 10 mils (i.e., 0.010 inch or about 0.254 mm). The wrapper may have a high elongation-to-break value, or ultimate elongation, which represents the strain on a sample of the wrapper when it breaks. In a specific embodiment, the wrapper may have an elongation value of 130% or greater. One side of the wrapper may be coated with an adhesive material (e.g., a high tack acrylic, a silicone adhesive, etc.) to facilitate adhesion of the wrapper to a substrate 100. Such an adhesive material may have a tackiness of "high" to "very high." In some embodiments, the wrapper may include a backing (e.g., a co-extruded multi-polymer backing, etc.), which may facilitate its positioning onto a substrate 100. The wrapper may be configured to bond securely to a substrate 100, while still being removable without tearing or slivering. In one embodiment, the wrapper may comprise a polyethylene film; for example, the Polyethylene Protective Tape 2E97C available from 3M of St. Paul, Minn. In another embodiment, the wrapper may comprise a polyvinyl chloride film, such as those marketed by Orafol Europe GmbH of Oranienburg, Germany as ORAGUARD® films (e.g., ORAGRUARD® 210, etc.).

In another embodiment, the mask material 106 may include a combination of a sealant (e.g., a dispensable or sprayable material, etc.) and a wrapper; for example, the mask material 106 may have a wrapper element covering a component or feature 102c of a substrate 100 and a glue located around the perimeter of the component or feature 102c. The sealant may form a seal between the substrate 100 and the periphery of the wrapper that secures the wrapper in place over the component or feature 102c FIG. 1C shows a mask material 106 that conforms to the shape of the component or feature 102c; in the illustrated embodiment, the mask material 106 may conform to surfaces that are oriented transverse to the direction from which the mask material 106 is applied (e.g., to the sides of the component or feature 102c, etc.). Before the mask material 106 is applied to a substrate 100, the mask material 106 may be treated. Treatment of the mask material 106 may cause it to substantially conform to the shape of the surface(s) to which it is applied (e.g., the shape of the component or feature 102c, etc.). In some embodiments, treatment of the mask material 106 may enable it to conform to the substrate 100 in response to natural forces, such as gravity. In a specific embodiment, treatment of the mask material 106 may comprise applying heat to the mask material 106. The heat may cause the mask material 106 to soften sufficiently to enable the mask material 106 to conform to the shape of each component or feature 102c of the substrate 100 to which the mask material 106 is applied. Additional forces (e.g., mechanical force, positive pressure, a vacuum, etc.) may be applied to the mask material 106 that cause it to substantially conform to the shape of the component or feature 102c.

In a more specific embodiment, where the mask material 106 comprise a hot melt adhesive, the hot melt adhesive may be heated to its softening point and, while remaining at a temperature at or above its softening point, applied to a substrate 100. The hot melt adhesive may then flow and conform to the shape of the portion of the substrate 100 to which it is applied (e.g., the component or feature 102c, etc.), or the hot melt adhesive may be molded to the shape of the component 102c while the hot melt adhesive is still soft.

In another specific embodiment, where the mask material 106 comprises a wrapper, the wrapper may be stretched and heated prior to its application to a substrate 100. The wrapper may then be subjected to pressure that causes it to substantially conform to the topography of the portion of the substrate 100 (e.g., the component or feature 102c, etc.) to which it is applied.

In the ensuing disclosure, reference numeral 106 may refer to the mask(s) formed from a mask material, rather than to the mask material itself.

Figure 2A:
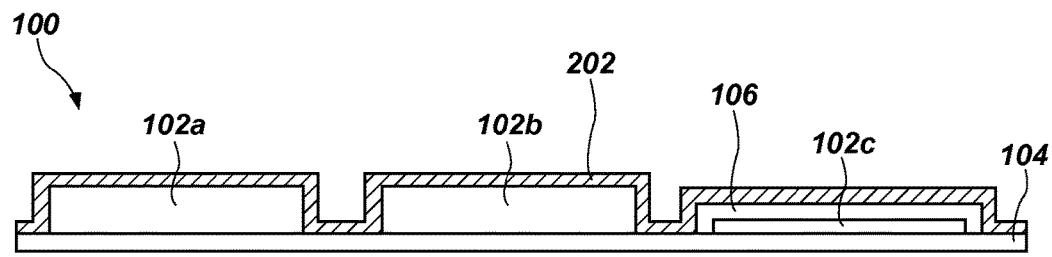
FIGS. 2A to 2C illustrate application of a protective coating to a substrate that has been masked, as well as removal of the mask and portions of the protective coating over the mask.

With one or more masks 106 in place on the substrate 100, a protective coating may be applied to the substrate 100. FIG. 2A illustrates an embodiment of a substrate 100 to which a protective coating 202 has been applied. The protective coating 202 may be configured to protect the substrate 100 from moisture (e.g., various forms of water, aqueous substances, other liquids, etc.) and/or contamination. The protective coating 202 may be applied using processes (e.g., chemical vapor deposition (CVD), molecular diffusion, physical vapor deposition (PVD) (e.g., evaporation deposition (including, but not limited to e-beam evaporation, sputtering, laser ablation, pulsed laser deposition, etc.), atomic layer deposition (ALD), and physical application processes (e.g., printing, spray-on techniques, rolling, brushing, etc.), etc.)) that are non-selective and non-directional, resulting in exposed components being coated regardless of whether or not it is ultimately desirable to coat every component or feature 102a-c of the substrate. In one embodiment, the protective coating 202 is applied such that it covers all exposed surfaces of the substrate 100, including any masks 106 on the substrate 100.

The protective coating 202 may be applied by a suitable coating element. In a specific embodiment, the coating element of an assembly system may comprise an apparatus that forms reactive monomers, which monomers may then be deposited onto and form polymers on one or more surfaces that are to be made moisture-resistant (e.g., water-resistant, waterproof, etc.). In specific embodiments, the coating element may be configured to deposit a protective coating 202 of a poly(p-xylylene) (i.e., parylene), including unsubstituted and/or substituted units, onto one or more surfaces that are to be rendered moisture-resistant. Examples of protective coatings 202 that function in this manner are described by U.S. patent application Ser. Nos. 12/104,080, 12/104,152 and 12/988,103, the entire disclosure of each of which is hereby incorporated herein. U.S. patent application Ser. Nos. 12/446,999, 12/669,074 and 12/740,119, the entire disclosures of all of which are, by this reference, incorporated herein, also disclose embodiments of equipment and/or processes that may be employed by a coating element of an assembly system to form protective coatings 202.

Other materials that may be applied by a coating element to form the protective coating 202 include, but are not limited to, thermoplastic materials and/or curable materials (e.g., radiation-curable materials, two-part materials, thermoset materials, room-temperature curable materials, etc.). A protective coating 202 may also be formed from an inorganic material, such as a glass or a ceramic material. A CVD or an ALD process may, in specific embodiments, be used for depositing a protective coating 202 comprising aluminum oxide ($Al_2O_3$) or a protective coating 202 consisting substantially of aluminum oxide.

Some techniques for applying a protective coating 202 are non-directional; that is, the protective coating 202 is applied non-selectively and adheres to all areas of a substrate that are exposed to the coating material(s). For example, using CVD processes, material that deposits on components 102a and 102b will also cover component 102c.

In the context of an entire assembly system, a plurality of different coating elements, and even different types of coating elements, may be used and, optionally, incorporated into the organization of the assembly system to provide desired types of protective coatings 202 on different types of features. Without limitation, one coating element may be configured to provide protective coating 202 in small spaces between different components or features 102a-c of a substrate, such as an electronic device under assembly (e.g., between surface mount technology (SMT) components and a circuit board, etc.), while another coating element may be configured to provide a conformal, blanketed protective coating 202 on surfaces that are exposed during the coating process, and another coating element may selectively apply a second protective coating 202 to certain other components or features 102a-c.

The protective coating 202 may provide moisture-resistance to the substrates 100, or at least to selected components or features 102a-c thereof, once the protective coating 202 is applied, as seen in FIG. 1B. A moisture-resistant protective coating 202 may prevent electrical shorting and/or corrosion of one or more components or features 102a-c of the substrate 100 in the event the substrate 100 is exposed to potentially damaging levels of moisture.

Any of a variety of metrics may be used to quantify the moisture-resistance of each protective coating 202. For example, the ability of a protective coating 202 to physically inhibit water or other moisture from contacting a coated feature may be considered to impart the protective coating 202 with moisture-resistance.

As another example, the water-resistance or, more broadly, the moisture-resistance of a protective coating 202 may be based on more quantifiable data, such as the rate at which water permeates through the protective coating 202, or its water vapor transfer rate, which may be measured using known techniques in units of $g/m^2/day$ or in units of $g/100\ in^2/day$ (e.g., less than 2 $g/100\ in^2/day$, about 1.5 $g/100\ in^2/day$ or less, about 1 $g/100\ in^2/day$ or less, about 0.5 $g/100\ in^2/day$ or less, about 0.25 $g/100\ in^2/day$ or less, about 0.15 $g/100\ in^2/day$ or less, etc., through a film having a minimum thickness or an average thickness of about 1 mil (i.e., about 25.4 µm), at a temperature of 37° C. and at a relative humidity of 90%).

Another way in which the moisture-resistance of a protective coating 202 may be determined is by the water contact angle of a droplet of water that has been applied to a surface of the protective coating 202 by an acceptable technique (e.g., the static sessile drop method, the dynamic sessile drop method, etc.). The hydrophobicity of the surface may be measured by determining the angle the base of the water droplet makes with the surface, from beneath a base of the water droplet; for example, using the Young equation, i.e.:

$$\theta_C = \arccos \frac{r_A \cos\theta_A + r_R \cos\theta_R}{r_A + r_R},$$

where $\theta_A$ is the highest, or advancing, contact angle; $\theta_R$ is the lowest, or receding, contact angle;

$$r_A = \sqrt[3]{\frac{\sin^3\theta_A}{2 - 3\cos\theta_A + \cos^3\theta_A}}\ ;\ \text{and}\ r_R = \sqrt[3]{\frac{\sin^3\theta_R}{2 - 3\cos\theta_R + \cos^3\theta_R}}\ .$$

If the surface is hydrophilic, the water will spread somewhat, resulting in a water contact angle of less than 90° with the surface. In contrast, a hydrophobic surface, which, for purposes of this disclosure, may be considered to be water-resistant or, more broadly, moisture-resistant, will prevent the water from spreading, resulting in a water contact angle of 90° or greater. The more the water beads on a surface, the greater the water contact angle. When water droplets bead on a surface such that the water contact angle with the surface is about 120° or more, the surface is considered to be highly hydrophobic. When the angle at which water contacts a surface exceeds 150° (i.e., a water droplet on the surface is nearly spherical), the surface is said to be "superhydrophobic."

Of course, other measures of water-resistance or other types of moisture-resistance may also be employed. While the coating element(s) of an assembly system may be configured to apply a protective coating 202 to exterior surfaces of one or more components or features 102a-c of a substrate 100, such as an electronic device under assembly, when the substrate 100 is incorporated into a fully assembled device (e.g., an electronic device, etc.), one or more surfaces on which a protective coating 202 resides may be located within an interior of the substrate. Thus, an assembly system may be configured to assemble an electronic device that includes a protective coating 202 on internal surfaces, or an internally confined protective coating 202.

Figure 2B:
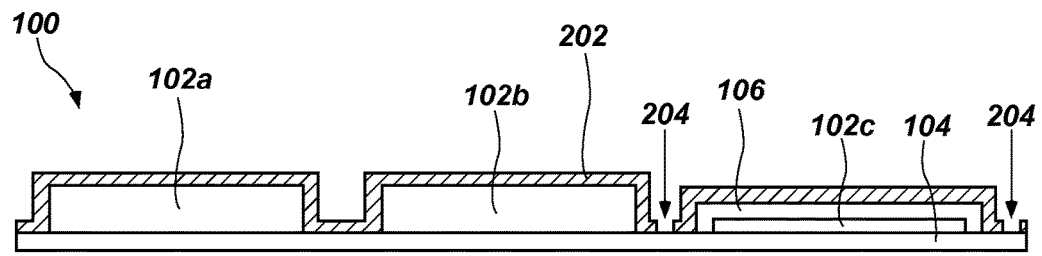

Turning now to FIG. 2B, once a protective coating 202 has been formed on a substrate 100 and over any masks 106 on the substrate 100, beneath the protective coating 202, one or more selected portions of the protective coating 202 may be removed from the substrate 100 (e.g., from locations over one or more components or features 102c of the substrate 100, etc.). In particular, FIG. 2B illustrates a cut 204 that has been formed in the protective coating 202 to facilitate its removal from the substrate 100. In one embodiment, the cut 204 may extend around a location from which a portion of the protective coating 202 is to be removed; for example, around the perimeters of a mask 106 and a component or feature 102c to which the mask 106 has been applied. The term "cut," as used herein, includes severed or weakened locations of a protective coating 202. Without limitation, a cut 204 may refer to a physical break of sufficient depth in the protective coating 202 to reach the substrate 100 or otherwise extend entirely through the protective coating 202. In such an embodiment, the cut 204 may sever, or separate, a portion of the protective coating 202 that resides over a component or feature 102c that is covered by a mask 106 from adjacent portions of the protective coating 202 that are to remain in place over the substrate 100. In another embodiment, the cut 204 may comprise a weakened location (e.g., a shallow incision, etc.) that does not extend completely through the protective coating 202. As another alternative, the cut 204 may comprise a perforation. Making a cut 204 before removing the mask 106 and portions of the protective coating 202 over the mask 106 may reduce the likelihood of tearing the protective coating 202 or otherwise unintentionally removing it from locations where it is supposed to remain.

The cut 204 may be formed in a variety of ways, including, but not limited to, those disclosed by the U.S. Provisional Patent Application No. 61/750,257, filed on Jan. 8, 2013 and titled METHODS FOR REMOVING PROTECTIVE COATING FROM AREAS OF AN ELECTRONIC DEVICE, by U.S. Provisional Patent Application No. 61/750,254, filed on Jan. 8, 2013 and titled METHODS FOR MASKING ELECTRONIC DEVICES FOR APPLICATION OF PROTECTIVE COATINGS AND MASKED ELECTRONIC DEVICES, and by PCT international patent application no. PCT/US2014/010510, filed on Jan. 7, 2014 and titled REMOVAL OF SELECTED PORTIONS OF PROTECTIVE COATINGS FROM SUBSTRATES, the entire disclosures of which are hereby incorporated herein.

Figure 2C:
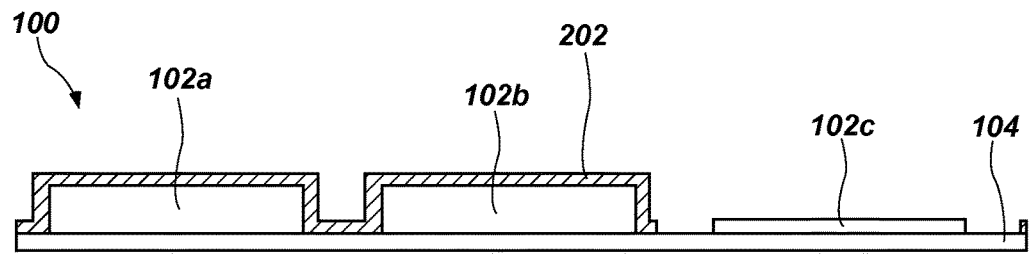

As seen in FIG. 2C, after the cut 204 is formed, the portion of the protective coating 202 that is to be removed from the substrate 100 and the corresponding mask 106 may be removed from the substrate 100. As a result, the portion(s) of the substrate 100 that were covered by the mask 106 (e.g., the component or feature 102c, etc.) may be exposed through the protective coating 202, while other portions of the substrate 100 (e.g., the components or features 102a and 102b, etc.) may continue to be covered by the protective coating 202.

Removal of portions of the protective coating 202 and the mask 106 from the substrate 100 may be effected manually or as part of an automated process. In one embodiment, a pick-and-place apparatus (e.g., a vacuum head, etc.) may be moved over the protective coating 202 after one or more cuts 204 are formed to selectively remove (e.g., pull, etc.) each cut portion of the protective coating 202 and the underlying mask 106 from the substrate 100, leaving desired areas (e.g., the component or feature 102c, etc.) exposed, as shown in FIG. 2C.

Figure 3A:
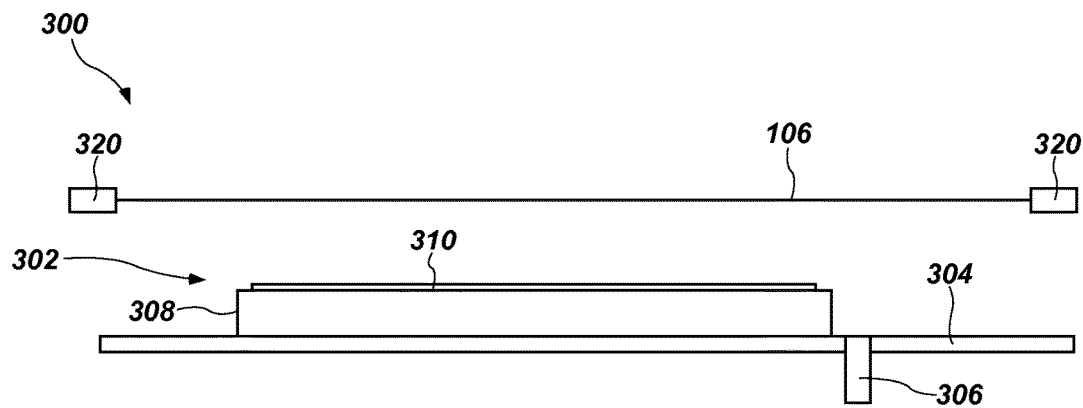
FIGS. 3A and 3B depict an embodiment of preparation of a preformed film to a substrate to define a mask on the substrate.

FIG. 3A illustrates a specific embodiment, in which a portion of a protective coating 202 and a corresponding mask 106 are removed from part of a subassembly 302 (shown as a front portion, although the same or similar processes may be used with other subassemblies or even other substrates) of an electronic device 300, such as a cellular telephone, a portable media player, a tablet computer or any other portable electronic device. The subassembly 302 may comprise a front portion of the electronic device that has not yet been assembled with a back portion of the electronic device 300, which, together, may form the housing of the electronic device 300, or the subassembly 302 may have been disassembled from other parts of the electronic device 300 (e.g., its corresponding back component, etc.). The support 304 may be a part of a system that moves the subassembly 302 from one station to another station of an assembly line. While FIG. 3A illustrates only one subassembly 302 on the support 304, the support 304 may be configured to hold multiple subassemblies 302, enabling a plurality of subassemblies 302 to be processed at about the same time.

In the illustrated embodiment, the subassembly 302 includes a display 310 carried by a support 304. A subassembly 302 may, of course, additionally or alternatively include other components, such as lenses, buttons, switches, ports, speakers, receivers or the like. The subassembly 302 may be oriented with the display 310 being readily accessible for masking. In certain embodiments, it may be desirable to apply the mask 106 to the display 310, including its outer periphery 308, to prevent the protective coating 202 from adhering to the display 310 and its outer periphery 308.

With the subassembly 302 in position, a mask material 106 may be applied to locations that are not to be covered by a subsequently formed protective coating 202. In the illustrated embodiment, the mask material 106 may comprise a wrapper, such as a polyethylene tape or a PVC tape. A retainer 320 may hold the mask material 106 in position above the support 304 in a manner that prepares the mask material 106 for application to the subassembly 302. For example, the retainer 320 may stretch or enable stretching of the mask material 106 in one or more directions.

Figure 3B:
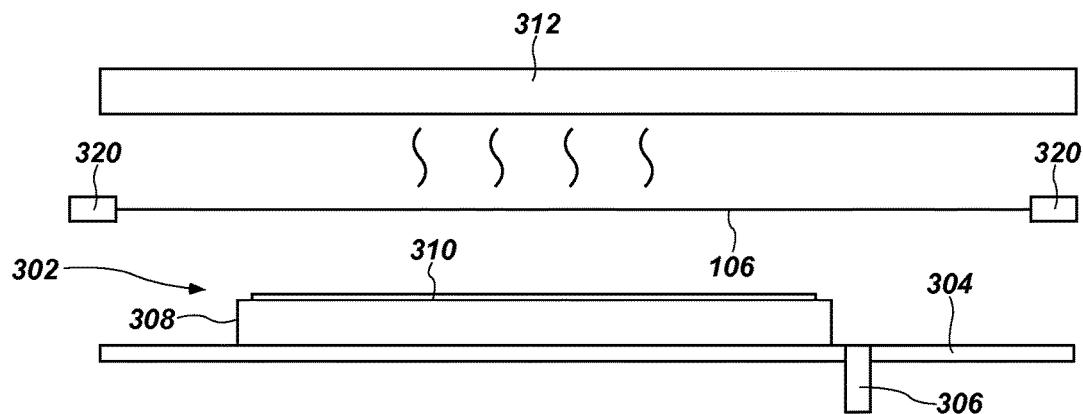

As shown in FIG. 3B, the mask material 106 may also be heated (e.g., by a heating element 312, etc.) to a predetermined temperature or to a temperature within a predetermined range of temperatures (depending, of course, upon the particular type of mask material 106 being used) to prepare it for application to the subassembly 302. The mask material 106 may be heated while it is held by the retainer 320, or it may be heated just before or during its application to the substrate 100. Heating the mask material 106 at a distance from the subassembly 302 may reduce the risk that the subassembly 302 will be damaged by the heat. However, in some embodiments, the mask material 106 may be applied to the subassembly 302, and then heated. Such an approach may enable the mask material 106 to conform to the shape of the part of the subassembly 302 to which it is applied.

Figure 4A:
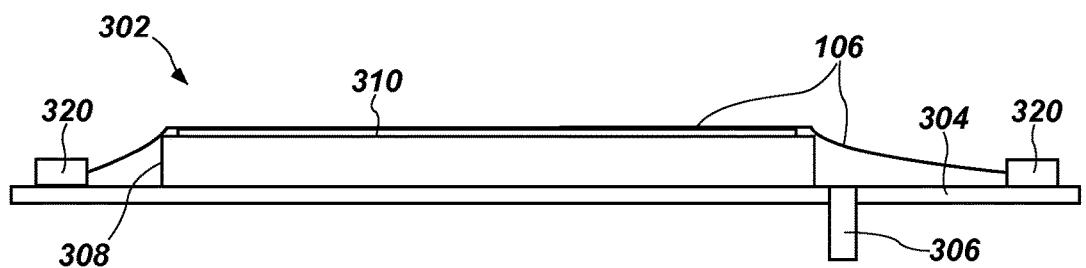
FIGS. 4A and 4B show an embodiment of a way in which a preformed film may be shaped to fit a selected area to be masked on the substrate.

FIG. 4A shows application of the mask material 106 to the subassembly 302 in such a way that the mask material 106 covers the display 310 of the subassembly 302. In embodiments where the mask material 106 comprises a wrapper, the retainer 320 may be used to manually or automatedly apply the mask material 106 to the subassembly 302. In the illustrated embodiment, the mask material 106 is applied to the display 310, to which it may adhere and, thus, mask the display 310 as a protective coating 202 is subsequently applied to the subassembly 302.

Figure 4B:
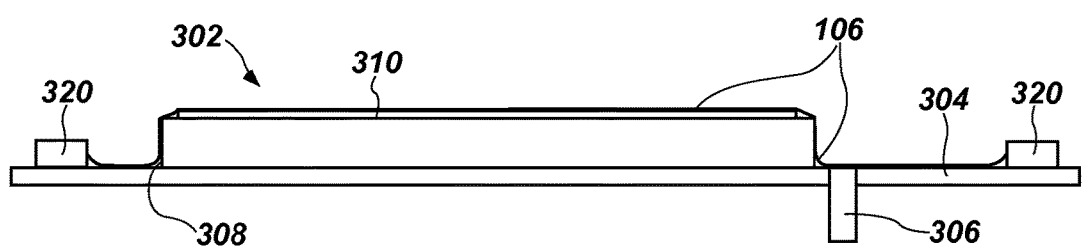

FIG. 4B illustrates the application of a vacuum 306 to the mask material 106 to cause the mask material 106 to substantially conform to the shape of the portion(s) of the subassembly 302 to which the mask material 106 is applied. In the illustrated embodiment, the mask material 106 may define a substantially enclosed space over the retainer 320 and the support 304, from which air or gases may be removed. The vacuum 306 may be positioned to apply a pressure differential on opposite sides of the mask material 106 (e.g., by way of applying a suction to the enclosed space, etc.), pulling the mask material 106 against the subassembly 302 to substantially conform to its shape.

As an alternative to the use of a vacuum 306 to cause the mask material 106 to conform to the shape of the subassembly 302, other approaches may be used. In some embodiments, force may be applied mechanically to the mask material 106 (e.g., using a press, a mold, etc.). In other embodiments, fluid (e.g., air, gas, a liquid, etc.) under positive pressure (i.e., pressure exceeding ambient pressure) may be applied onto a side of the mask material 106 opposite from the subassembly 302 in order to press the mask material 106 against the subassembly 302.

When the mask material 106 conforms to the shape of the subassembly 302, it may be secured to the subassembly 302. Without limitation, the mask material 106 may adhere to the subassembly 302 upon conformation or subsequent treatment. In more specific embodiments, a mask material 106 that shrinks under elevated temperature (e.g., a so-called "shrink wrap" material, etc.) may be heated after it has been applied to the subassembly 302 to tighten the mask material 106, which may shape it to better fit the subassembly 302 and at least partially mechanically secure the mask 106 to the subassembly 302.

Any excess material (e.g., loose portions around the periphery of the mask 106, etc.) may then be cut, and the subassembly 302, with mask 106 in place, may be removed from the support 304. The subassembly 302 may then be ready for the coating 202 to be applied. The mask material 106 may prevent the coating 202 from being formed on the display 310 and the outer periphery 308, and may also protect the display 310 and the outer periphery 308 from scratches or other damage during application of the coating 202.

Figure 5:
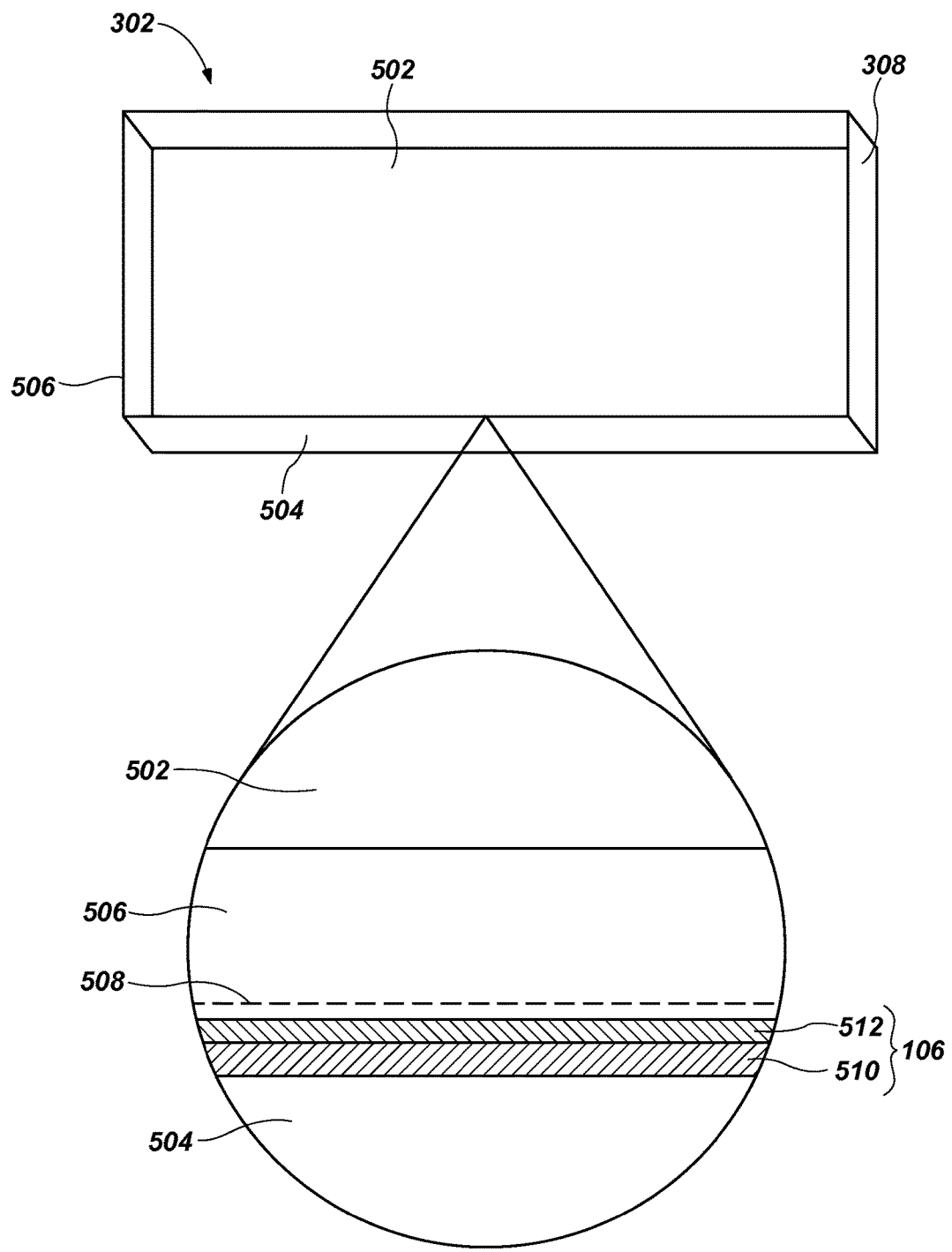
FIG. 5 is a schematic representation of an interior of a portion of an electronic device, showing the coating cut at an edge of the portion to facilitate removal of a mask.

FIG. 5 provides a view of a side of the subassembly 302 to which no mask material 106 has been applied, and on which a protective coating 202 is to remain. The outer periphery 308 of the subassembly 302, to which the mask material 106 is applied, can be seen in FIG. 5. More specifically, FIG. 5 is a view of the subassembly 302 with the display 310 (FIG. 4B) facing down, showing an interior 502 of the subassembly 302—the side to which no mask material 106 has been applied. Although not shown, the subassembly 302 may include a plurality of electronic components within the interior 502 that may be beneficially provided with a protective coating 202. With a mask 106 on the display side and the outer periphery 308 of the subassembly 302—its exterior 504, a protective coating 202 may be applied to the interior 502.

As shown in FIG. 5, an edge 506 around the outer periphery 308 of the subassembly 302 defines a boundary between the interior 502 and the exterior 504. The embodiment of mask 106 depicted by FIG. 5 includes a wrapper 510 and an adhesive 512. In such an embodiment, the wrapper 510 may be applied as described above in connection with FIGS. 3A through 4B. The wrapper 510 may be applied in such a way that it adheres to the outer periphery 308. In addition, the wrapper 510 may wrap at least partially onto the edge 506. Alternatively, the wrapper 510 may only extend to a corner between the outer periphery 308 and the edge 506, or to a location on the outer periphery 308.

The mask 106 may also include an adhesive 512. The adhesive 512 may be applied before or after the wrapper 510 is applied to the subassembly 302. The adhesive 512 may be applied adjacent to or around a peripheral edge 506 of the wrapper 510 to secure the outer periphery of the wrapper 510 to the subassembly 302, and to prevent material of a protective coating 202 from creeping between the wrapper 510 and the subassembly 302.

Once the protective coating 202 is applied to the interior 502 of the subassembly 302, the mask 106 and portions of the protective coating 202 thereover may be removed. Without limitation, the protective coating 202, at the peripheral edge 506 of the subassembly 302 (e.g., along line 508, etc.), may be removed, cut or weakened. By removing, cutting or weakening the protective coating 202 at locations outside the outer perimeter of the mask 106, the entire mask 106 may be removed from the subassembly 302.

In another embodiment, the entire peripheral edge 506 of the subassembly 302 may be subjected to a material removal process to remove portions of the protective coating 202, any adhesive 512 and any portion of the wrapper 510 on or over the edge 506. Any remaining portion of the wrapper 510 and the adhesive 512 may then, along with overlying portions of the protective coating 202, be removed from the subassembly 302, including its display 310. Other portions of the protective coating 202 will remain over components or features 102 in the interior 502 of the subassembly 302.

The mask 106 may protect the display 310 or other features of the subassembly 302 during the assembly process, and even during subsequent storage and shipment. The mask 106, in such an embodiment, may include a tab or other protrusion that allows a user to easily remove it from the display 310 or from another component or feature of the subassembly 302; e.g., by a consumer.

Figure 6:
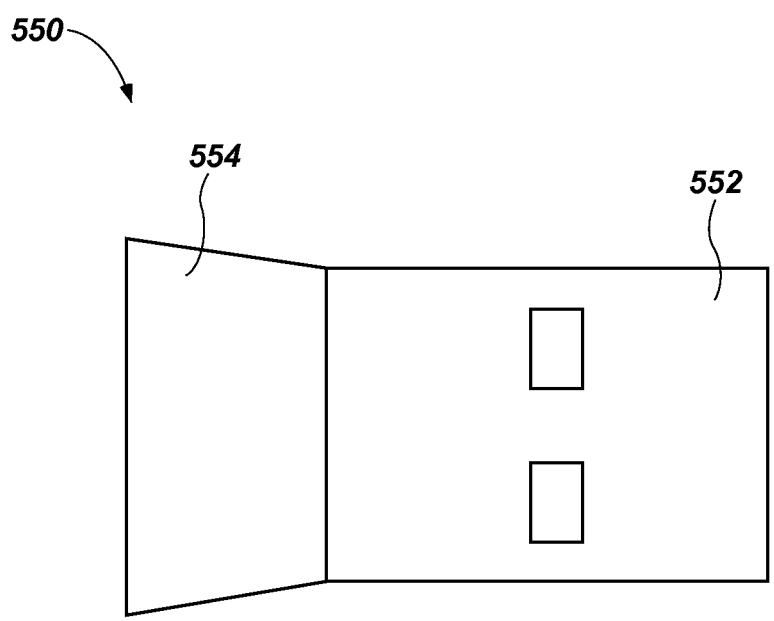
FIG. 6 shows an embodiment of an insertable mask element.

In certain embodiments, other masking elements may be used to prevent undesired application of a protective coating 202 (see, e.g., FIG. 2A) to certain components or features 102 of a substrate 100 (see, e.g., FIG. 2A). For example, as shown in FIG. 6, a masking element 550, which is also referred to herein as a "plug," may be configured for insertion into one or more ports of an electronic device, such as a Universal Serial Bus (USB) port, another communication port, an audio jack receptacle, or the like. Such an internal masking element 550 may include an insertable part 552 and a manipulation part 554. The insertable part 552 may be sufficiently rigid to enable its insertion into a port and its retention therein. The insertable part 552 may be shaped complementarily to at least a portion of the port, may be formed from or include a coating of a solid, somewhat compressible, resilient material, and may be configured to be inserted into the port in a manner that prevents introduction of a material that forms the protective coating 202 (see, e.g., FIG. 2A) into the port (or at least into masked portions thereof) and onto the masked electrical contacts thereof. In some embodiments, an insertable part 552 of a masking element 550 may be configured to allow for selective deposition of a protective coating 202 onto selected features within a port. For example, the insertable part 552 may be configured to cover the electrical contacts of the port, but leave other features of the port exposed to the material from which the protective coating 202 is formed. Another, manipulation part 554 of a masking element 550 is configured to enable removal of the insertable part 552 from a port. The manipulation part 554 may protrude from an electronic device when the insertable part 552 is inserted into a port. The configuration of the manipulation part 554 enables removal of the insertable part 552 of the insertable masking element 550 from the port. Such an insertable masking element 550 may be reusable. With an insertable part 552 of a masking element 550 inserted into a port of an electronic device (and, optionally, another mask material is used to create a seal between a boundary between the masking element 550 and an exterior surface of the electronic device of which the port is a part), a protective coating 202 may be applied to the electronic device and to the insertable masking element. The protective coating 202 at locations surrounding the port may be cut, weakened or removed, and the masking element 550 may then be removed from the port. The masking element 550 may then be used to protect a port of another electronic device or subassembly.

Figure 7:
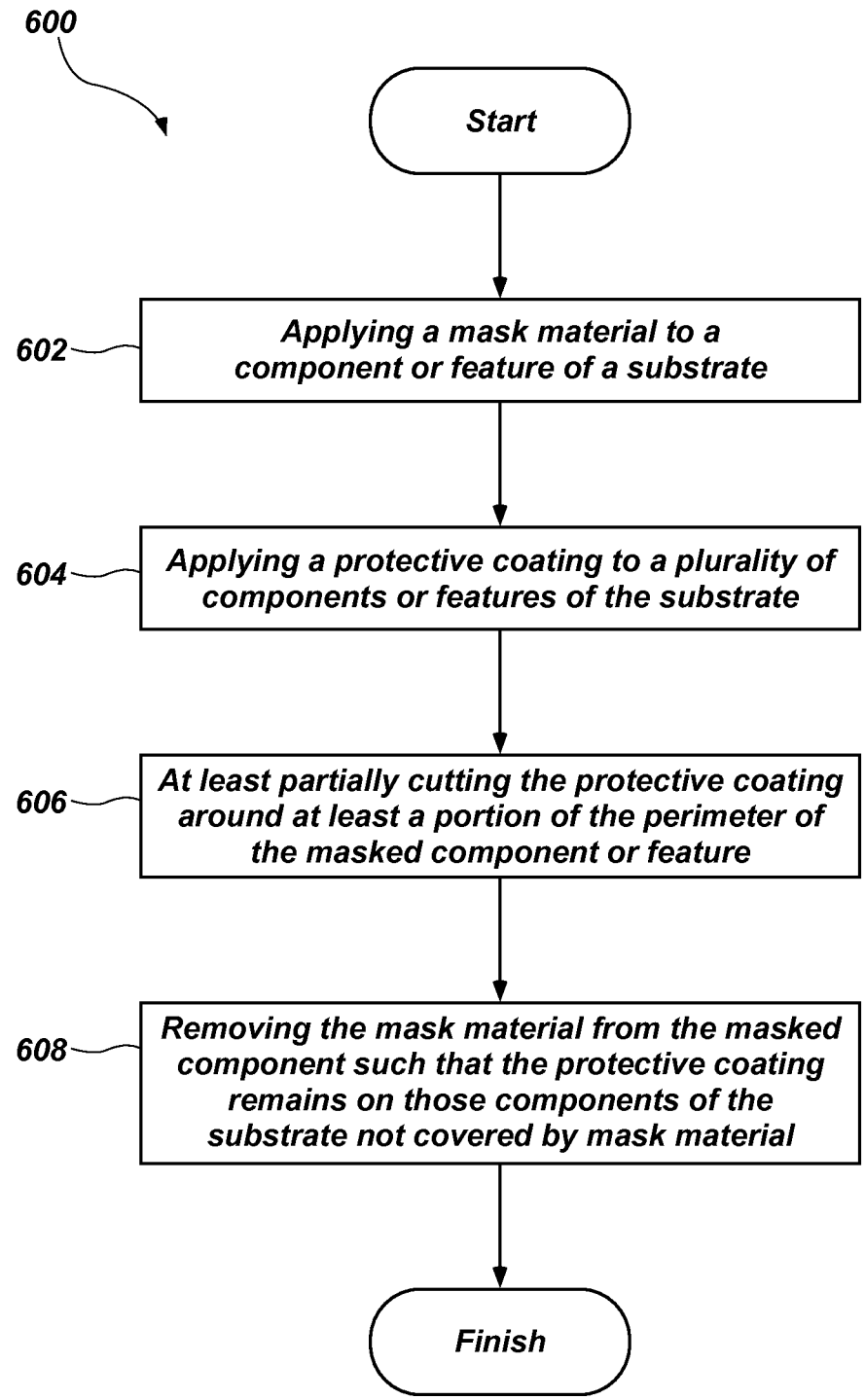
FIG. 7 is a flow chart illustrating an embodiment of a method for applying a mask material to a substrate.

FIG. 7 illustrates an embodiment of a method 600 for applying a mask to one or more components or features of a substrate 100 (see, e.g., FIG. 2A). At reference numeral 602, a mask 106 (see, e.g., FIG. 2A) may be applied to or formed on a component or feature 102 of the substrate 100. At reference numeral 604, a protective coating 202 may be applied to the substrate 100, including any masked components or features 102. Thereafter, at reference numeral 606, the protective coating 202 may be cut or weakened, or material may be removed therefrom, at locations over or just outside of the perimeter of each mask 106. Next, at reference numeral 608, if desired, selected portions of the protective coating 202, including each portion of the protective coating 202 located over a mask 106, may be removed from the substrate 100.

Although the foregoing disclosure provides many specifics, these should not be construed as limiting the scope of any of the ensuing claims. Other embodiments may be devised which do not depart from the scopes of the claims. Features from different embodiments may be employed in combination. The scope of each claim is, therefore, indicated and limited only by its plain language and the full scope of available legal equivalents to its elements.

What is claimed:

1. A method for protectively coating a substrate, comprising:
    introducing a flowable mask material into at least one selected communication port of a substrate to define a mask in the at least one selected communication port, the flowable mask material substantially conforming a shape of a surface of the at least one selected communication port under natural force;
    applying a mechanical force to the flowable mask material to conform the flowable mask material to the shape of the surface of the at least one selected communication port after the flowable mask material has been introduced into the at least one selected communication port, wherein the mechanical force is applied by an instrument that does not form a part of a finished device including the substrate, wherein the mask bonds to the substrate;
    applying a protective coating over the substrate and over the mask, such that the protective coating adheres to the substrate and the mask;
    cutting the protective coating at locations outside an outer perimeter of the mask, wherein cuts from the cutting the protective coating does not extend completely through the protective coating; and
    removing the mask and at least a portion of the protective coating over the mask.

2. The method of claim 1, wherein introducing the flowable mask material comprises introducing the flowable mask material into a connector of an electronic assembly and wherein the mechanical force applied by the instrument is different than an applicator instrument that applies the liquid masking material.

3. The method of claim 1, wherein introducing the flowable mask material comprises introducing a hot melt adhesive into the at least one selected communication port.

4. The method of claim 1, wherein removing the mask and at least the portion of the protective coating over the mask comprises removing locations of the protective coating over or adjacent to a perimeter of the mask material.

5. The method of claim 4, further comprising:
    pulling at least the portion of the protective coating from the mask material or from the substrate.

6. The method of claim 5, further comprising:
    pulling the mask material from the substrate, with a portion of the protective coating remaining on protected areas of the substrate.

7. The method of claim 1, further comprising:
    inserting a plug into the at least one selected communication port in the substrate before introducing the flowable mask material.

8. The method of claim 7, wherein introducing the flowable mask material comprises applying a seal around the plug to create a seal between the plug and the substrate at an opening of the at least one selected port.

9. A method for applying a protective coating to a substrate, comprising:
    applying a liquid mask material to at least one selected location of an electronic device assembly, the at least one selected location being a location to be exposed through a protective coating, including introducing the liquid masking material into at least one communication port of the electronic device assembly, the liquid mask material flowing to substantially conform to a shape of a surface of the at least one selected location of the electronic device assembly upon being applied to the at least one selected location of the electronic device assembly;
    applying a mechanical force to the liquid mask material to conform the liquid mask material to the shape of the surface of the at least one selected location after the liquid mask material has been applied to the at least one selected location, wherein the mechanical force is applied by an instrument that does not form a part of a finished device including the substrate;
    allowing the liquid mask material to substantially harden and bond to the substrate, by cooling to an ambient temperature, to define a mask;
    after the mask is hardened, applying the protective coating over the mask and the electronic device assembly, such that the protective coating adheres to the mask and the electronic device assembly;
    cutting the protective coating at locations outside an outer perimeter of the mask; and
    removing the mask and at least a portion of the protective coating over the mask.

10. The method of claim 9, wherein applying the protective coating over the mask comprises applying a coating comprising poly(p-xylylene) and wherein the mechanical force applied by the instrument is different than an applicator instrument that applies the liquid masking material.

11. The method of claim 9, wherein applying the protective coating over the mask comprises applying a coating comprising aluminum oxide.

* * * * *